(12) United States Patent
Engin

(10) Patent No.: US 9,425,922 B2
(45) Date of Patent: Aug. 23, 2016

(54) REDUCED MEMORY ITERATIVE BASEBAND PROCESSING

(71) Applicant: NXP B.V., Eindhoven (NL)

(72) Inventor: Nur Engin, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/461,030

(22) Filed: Aug. 15, 2014

(65) Prior Publication Data

US 2016/0050047 A1    Feb. 18, 2016

(51) Int. Cl.
*H04L 1/00*   (2006.01)
*H03M 7/00*   (2006.01)
*H03M 13/29*  (2006.01)
*H03M 13/37*  (2006.01)
*H03M 13/00*  (2006.01)

(52) U.S. Cl.
CPC ............... *H04L 1/0054* (2013.01); *H03M 7/00* (2013.01); *H03M 13/2957* (2013.01); *H03M 13/3776* (2013.01); *H03M 13/6325* (2013.01); *H03M 13/6505* (2013.01); *H03M 13/6588* (2013.01)

(58) Field of Classification Search
CPC ..................... H03M 13/2957; H03M 13/3905; H03M 13/6502; H03M 13/6505; H03M 13/6588; H03M 13/23; H03M 13/2703; H03M 7/00; H03M 13/6325; H03M 13/3776; H04L 1/005; H04L 25/03171; H04L 1/0054; H04L 1/0071; H04L 2025/03611; H04L 25/03286
See application file for complete search history.

(56) References Cited

U.S. PATENT DOCUMENTS

| 5,497,435 | A  | * | 3/1996  | Berger .......................... 382/249 |
| 6,671,338 | B1 | * | 12/2003 | Gamal .................. H04L 1/0048 375/144 |
| 2003/0058873 | A1 | * | 3/2003 | Geiger et al. ................. 370/401 |
| 2004/0196927 | A1 | * | 10/2004 | Jin et al. ........................ 375/316 |
| 2005/0138530 | A1 |   | 6/2005  | Huang |
| 2009/0103601 | A1 |   | 4/2009  | Du |
| 2010/0005356 | A1 | * | 1/2010  | Cho et al. ....................... 714/749 |
| 2011/0293052 | A1 | * | 12/2011 | Serbetli ......................... 375/346 |

FOREIGN PATENT DOCUMENTS

| DE | 19934646 A1    | 2/2001 |
| WO | 2012/175636 A1 | 12/2012 |
| WO | 2014029425 A9  | 2/2014 |

OTHER PUBLICATIONS

Hagenauer, et al., "A Viterbi Algorithm with Soft-Decision Outputs and its Applications", German Aerospace Research Establishment (DLR) Institute for Communications Technology.

(Continued)

*Primary Examiner* — Vineeta Panwalkar

(57) ABSTRACT

A receiver, including: a posteriori probability demodulator configured to receive an input digital signal and output demodulated data; a deinterleaver configured to deinterleave the demodulated data; a forward error correction (FEC) decoder configured to error correct the demodulated data; a FEC encoder configured to encode the error corrected demodulated data; an interleaver configured to interleave the FEC encoded data and output the interleaved FEC encoded data to the posteriori probability demodulator; and a symbol compressor/decompressor configured to compress symbol data from the a posteriori demodulator and store the compressed data in a symbol memory and configured to decompress compressed symbol data stored in the symbol memory.

20 Claims, 7 Drawing Sheets

(56) References Cited

OTHER PUBLICATIONS

Peleg, et al., "Iterative decoding for coded noncoherent MPSK communications over phase-noisy AWGN channel", IEEE Proc. Commun. vol. 147, No. 2, Apr. 2000.
Serbetli, "Technical Note NXP-R-TRN-2011-0023", issued Apr. 2011, Iterative Demodulation & Decoding Methods for Differential Modulated Systems.
Van Houtum, "Jonit and iterative detection and decoding of differentially encoded COFDM systems", 2010 17th International Conference on Telecommunications.
European Search Report for EP Application No. 15 17 9282 dated Jan. 11, 2016.
Ariyoshi, et al., "Improvement on Turbo Code Decoder by Updating Redundant Likelihood Information", IEEE 59th Vehicular Technology Conference, VTC, May 17, 2004, 1014-1018.
Matteo, et al., "Maximum Mutual Information Vector Wuantiation of log-likelihood Ratios for Memory Efficient HARQ Implementations", Data Compression Conference, Mar. 24, 2010, 30-39.
Rosati, et al., "LLR Compression for BICM Systems Using Large Constellations", IEEE Transactions on communications, Jul. 1, 2013, 2864-2875.
Xiaodong, et al., "Bit-Interleaved Coded Modulation With Iterative Decoding and 8PSK Signaling", IEEE Transactions on Communication, IEEE Service Center Piscataway, NJ, Aug. 1, 2002, 1250-1255.

* cited by examiner

REDUCED MEMORY ITERATIVE BASEBAND PROCESSING

TECHNICAL FIELD

Various exemplary embodiments disclosed herein relate generally to reduced memory iterative baseband processing in communication systems.

BACKGROUND

Baseband processing for wireless receivers mostly includes demodulation, deinterleaving, and forward error correction (FEC) steps. Depending on the modulation scheme at the transmitter and the characteristics of the wireless channel, various schemes can be introduced to improve (i.e., decrease) the bit error rate (BER) of the received signal. Many of these techniques use the knowledge of the transmitted signal characteristics (such as modulation type and pilot data) to detect as accurately as possible the channel characteristics and compensate for them.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to a receiver, including: a posteriori probability demodulator configured to receive an input digital signal and output demodulated data; a deinterleaver configured to deinterleave the demodulated data; a forward error correction (FEC) decoder configured to error correct the demodulated data; a FEC encoder configured to encode the error corrected demodulated data; an interleaver configured to interleave the FEC encoded data and output the interleaved FEC encoded data to the posteriori probability demodulator; and a symbol compressor/decompressor configured to compress symbol data from the a posteriori demodulator and store the compressed data in a symbol memory and configured to decompress compressed symbol data stored in the symbol memory.

Further, various exemplary embodiments relate to a receiver, including: a posteriori probability demodulator configured to receive an input digital signal and output demodulated data; a deinterleaver configured to deinterleave the demodulated data; a soft input soft output (SISO) decoder configured to decode the demodulated data; an interleaver configured to interleave the demodulated data and output the interleaved demodulated data to the posteriori probability demodulator; and a symbol compressor/decompressor configured to compress symbol data from the a posteriori demodulator and store the compressed data in a symbol memory and configured to decompress compressed symbol data stored in the symbol memory.

Further, various exemplary embodiments relate to a non-transitory machine-readable storage medium encoded with instructions for execution by a processor in a receiver, including: instructions for a posteriori probability demodulating an input digital signal and outputting demodulated data; instructions for deinterleaving the demodulated data; instructions for a forward error correction (FEC) decoding the demodulated data; instructions for FEC encoding the error corrected demodulated data; instructions for interleaving the FEC encoded data; instructions for compressing symbol data from the demodulated data and storing the compressed data in a symbol memory; and instructions for decompressing compressed symbol data stored in the symbol memory.

Further, various exemplary embodiments relate to a non-transitory machine-readable storage medium encoded with instructions for execution by a processor in a receiver, including: instructions for a posteriori probability demodulating an input digital signal and outputting demodulated data; instructions for deinterleaving the demodulated data; instructions for soft input soft output (SISO) decoding the demodulated data; instructions for interleaving the SISO encoded data; instructions for compressing symbol data from the demodulated data and storing the compressed data in a symbol memory; and instructions for decompressing compressed symbol data stored in the symbol memory.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Figure 1:
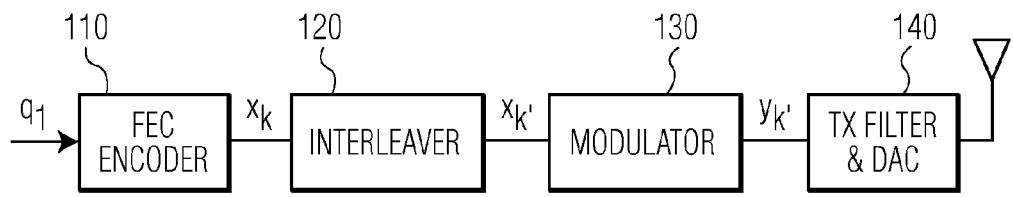
FIG. 1 illustrates a block diagram of a typical digital transmission baseband system.

FIG. 1 illustrates a block diagram of a typical digital transmission baseband system. The digital transmission baseband system includes a forward error correction (FEC) encoder 110, an interleaver 120, a modulator 130, and a transmission (TX) filter and digital to analog converter (DAC) 140.

Typically, baseband modulation and coding starts with a sequence of information bits $q_l$ where l=1, 2, . . . , L. The information bits $q_l$ are first encoded by the FEC encoder 110 using a forward error correction method, where parity bits are added, resulting in encoded bit sequence $x_k$ where k=1, 2, . . . K, K=L/R and where R is the code rate of the FEC encoder 110. For example, if R=⅓ the number of encoded bits $x_k$ is three times of bits $q_l$, or K=3L. After encoding, the encoded bits are interleaved by the interleaver 120 resulting in a reordering of the sequence $x_k \rightarrow x_{k'}$. Next, the bits may be modulated by the modulator 130 according to a single carrier or OFDM modulation method to obtain $y_{k'}$. Then, the symbols are converted to analogue signal and transmitted over a wireless channel by the TX filter and DAC 140.

Figure 2:
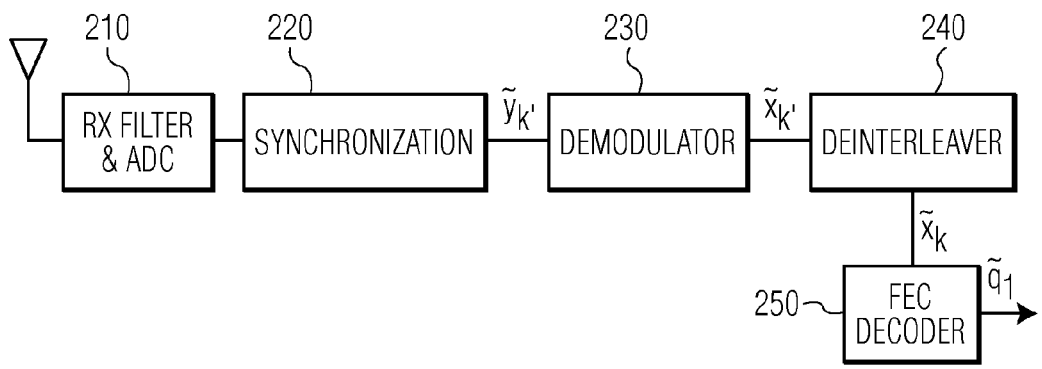
FIG. 2 illustrates a block diagram of a typical digital receiver baseband system.

FIG. 2 illustrates a block diagram of a typical digital receiver baseband system. The digital receiver baseband system includes a receiver (RX) filter and analog to digital converter (ADC) 210, a synchronizer 220, a demodulator 230, a deinterleaver 240, and an FEC decoder 250. At the digital receiver baseband system, reverse processing steps to those of the digital transmission baseband system are taken to recover the information bits based on the received signal. First, the RX filter and ADC 210 and synchronizer 220 convert the received analog signal to a digital signal including the symbols $\tilde{y}_{k'}$. The symbols $\tilde{y}_{k'}$ are received by the demodulator 230. These symbols will have been modified by a time-varying channel function and additive noise:

$$\tilde{y}_{k'} = H_{k'} \cdot y_{k'} + n_{k'}.$$

Depending on the modulation scheme, the demodulator 230 estimates the channel, corrects for the channel effects and calculates the log likelihood ratios (LLR) of the encoded time interleaved bits $x_{k'}$, defined as:

$$\tilde{x}_{k'} = LLR(x_{k'}) = \log\left(\frac{P(x_{k'} = 1)}{P(x_{k'} = 0)}\right).$$

The deinterleaver 240 next deinterleaves the LLR values obtained from demodulator 230. Deinterleaving causes the errors to be well-spread out in time. After deinterleaving, the LLR values are used as soft input by the FEC decoder to correct errors such that the number of errors in the received bit stream $\tilde{q}_l$ may be minimized.

The quality of the received signal is evaluated by calculating the bit error rate (BER) of $\tilde{q}_l$ $$BER = \frac{1}{L}\sum_{l=1}^{L}(q_l - \tilde{q}_l).$$

The BER resulting depends on the modulation type, channel conditions and the demodulation and decoding method applied at the receiver. Lower BER may be achieved when better reliability information (LLR) is obtained from demodulation. Especially when channel conditions cannot be estimated accurately, reducing the BER is challenging.

For various modulation and coding schemes, one way of achieving a lower BER in a given channel condition is iterative demodulation and decoding. Examples of such modulating and coding schemes include various types of phase shift keying and orthogonal frequency-division multiplexing (OFDM). Whereas in the first case described above the signal is demodulated and decoded once, in case of iterative demodulation and decoding, this process is repeated with the aim of improving the BER in the consecutive iterations.

Specifically, the incoming data $\tilde{y}_{k'}$ is processed by the full demodulation, deinterleaving, and FEC decoder methods to obtain $\tilde{q}_l$. Then the output of the FEC decoder is used to demodulate the signal once again, by correcting the (a-priori) input data using the new (extrinsic) information obtained from the FEC decoder.

Figure 3:
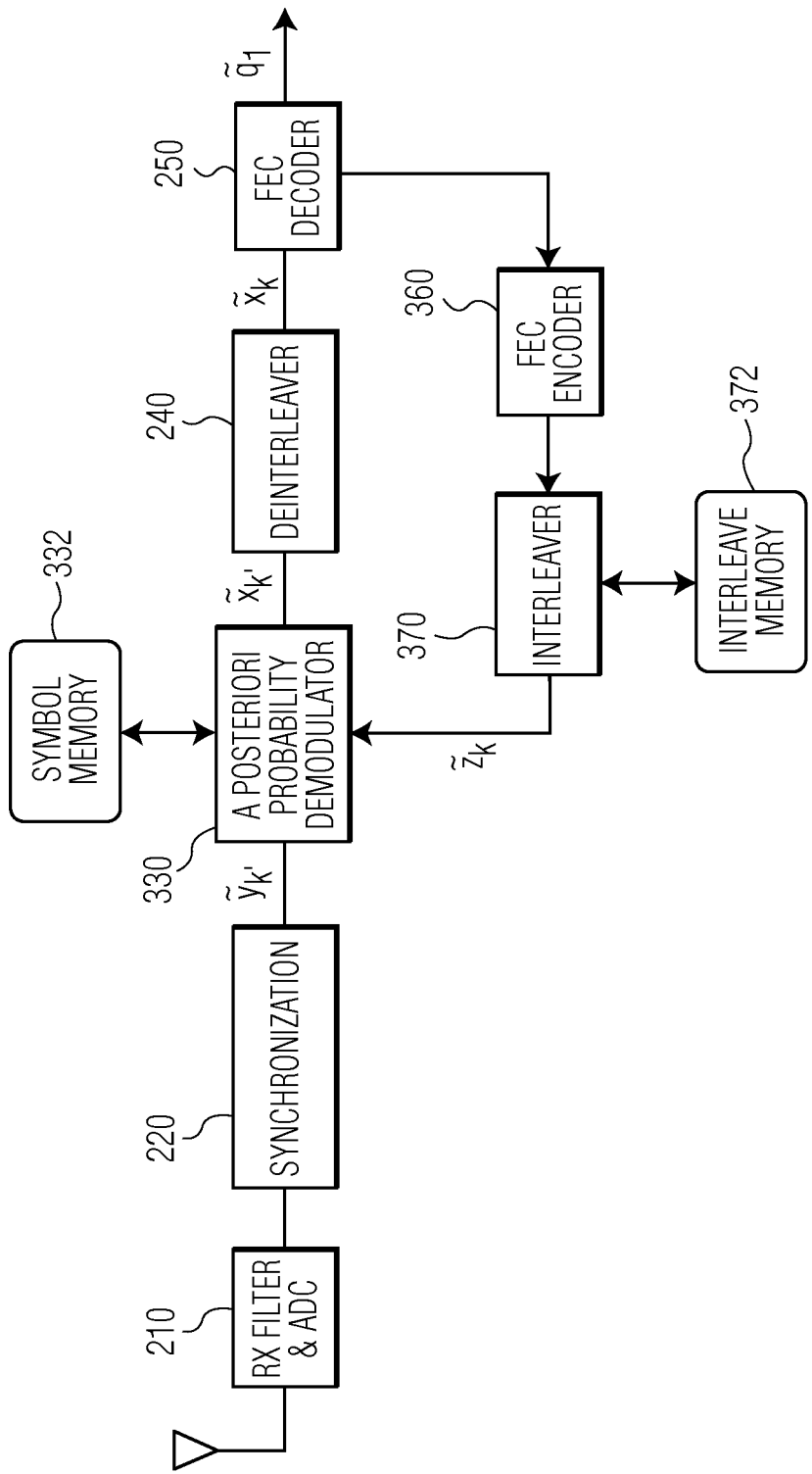
FIG. 3 illustrates a block diagram of a digital receiver baseband system using iterative demodulation and decoding.

FIG. 3 illustrates a block diagram of a digital receiver baseband system using iterative demodulation and decoding. The iterative receiver system includes the same basic elements as the receiver system in FIG. 2, but adds an iterative FEC encoder 360, iterative interleaver 370, interleave memory 372, and symbol buffer 332. Further, the demodulator 230 is replaced with an a posteriori probability demodulator 330. In case of a digital reception system including a hard-output FEC decoder, the output is re-encoded by the iterative FEC encoder 360 and interleaved by the iterative interleaver 370 to produce extrinsic information $\tilde{z}_k$. The a posteriori demodulator 330 then performs a second demodulation using the extrinsic information $\tilde{z}_k$ produce an improved estimate of the received signal. Further, the symbol buffer 332 is needed in order to store the incoming data $\tilde{y}_{k'}$ for the second iteration of demodulation processing. This is because of the additional delay introduced by the de-interleaver. In order to perform the demodulation operation in the second iteration, the corresponding extrinsic information $\tilde{z}_k$ needs to later be available. Further, the interleave memory 372 is additional memory needed to store data for use by the iterative interleaver 370.

Figure 4:
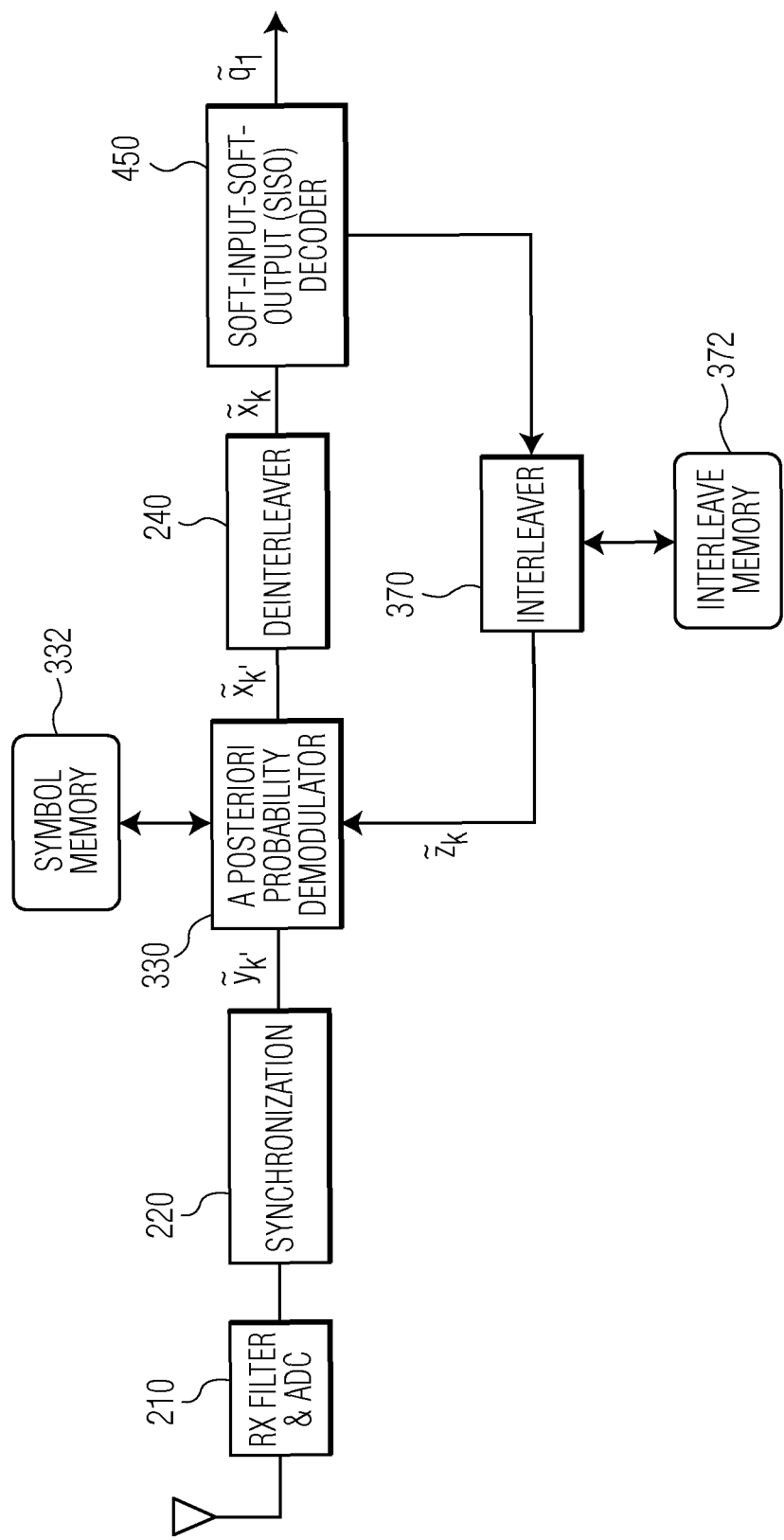
FIG. 4 illustrates a block diagram of a second embodiment of a digital receiver baseband system using iterative demodulation.

FIG. 4 illustrates a block diagram of a second embodiment of a digital receiver baseband system using iterative demodulation. The second embodiment includes a soft-input-soft-output (SISO) decoder 450. The SISO decoder 450 generates soft output values corresponding to encoded bits so the re-encoding is not needed. This second iterative receive system includes the same basic elements as the receiver system in FIG. 2, but adds iterative interleaver 370, interleave memory 372, and symbol buffer 332. As above, the demodulator 230 is replaced with an a posteriori probability demodulator 330. The outputs of the SISO decoder are then interleaved by the iterative interleaver 370 and demodulated using a posteriori information in the a posteriori probability demodulator 330.

The changes required to implement the iterative demodulation will increase the area and/or software complexity of the receiver, thereby increasing cost of the resulting receiver. So lower BER is achieved but at a higher system cost.

In case of some wireless standards, long interleavers are added to help correct the time selective fading that may occur in the wireless channel. This is especially the case with broadcast standards. When the long interleaver is present, supporting iterative demodulation and coding becomes excessively memory intensive because of the additional input buffer and interleave memories.

For a quantitative example the digital audio broadcasting (DAB) standard may be considered. In the DAB standard, a time (de)interleaving length of 384 ms is required. Assuming a receiver that receives all available services, this translates to about a 330 kbyte deinterleaving memory (assuming 5 bits per LLR value), which is already present in the system for (open-loop) reception. As DAB uses DQPSK (differential QPSK) modulation, at the input side each two LLR values correspond to a complex value of a 16 bit real value and a 16 bit imaginary value. As a result, when iterative demodulation and decoding is done, the symbol buffer memory becomes 330*16 (bits per real/imaginary)/5 bits per LLR≈1 Mbyte. Additionally, an interleave memory is needed that will be 330*R/5 where R is the coding rate and 5-bit soft inputs are assumed. For R=2, the required interleaver memory will be 33 kbyte for hard feedback and 165 kbyte for soft feedback.

Because of the large memory requirements, supporting iterative demodulation and coding becomes too expensive for broadcast reception systems. The embodiments described below reduce memory requirements by using methods to limit the input buffer memory required for iterative demodulation and decoding.

In an iterative baseband receiver it may be possible to use a fraction of the precision in the symbol buffer data for the second iteration. During the first iteration, full precision input is used because no storage is required at this stage. For the second iteration, as the information from the first iteration is there to assist the demodulation, even a much lower precision may yield a high performance. Further, full precision extrinsic information $\tilde{z}_k$ may be converted to a lower precision and stored for use in the next iteration. As discussed below simulations have been run to verify that high performance may still be obtained by using a reduced precision information from the first iteration. Further, compression may also be applied to data stored in the interleave memory. Thus, the embodiments described below may take two measures in order to limit the amount of memory required because of iterative reception: compression of bits in the symbol buffer; and compression of bits at the interleave memory.

Figure 5:
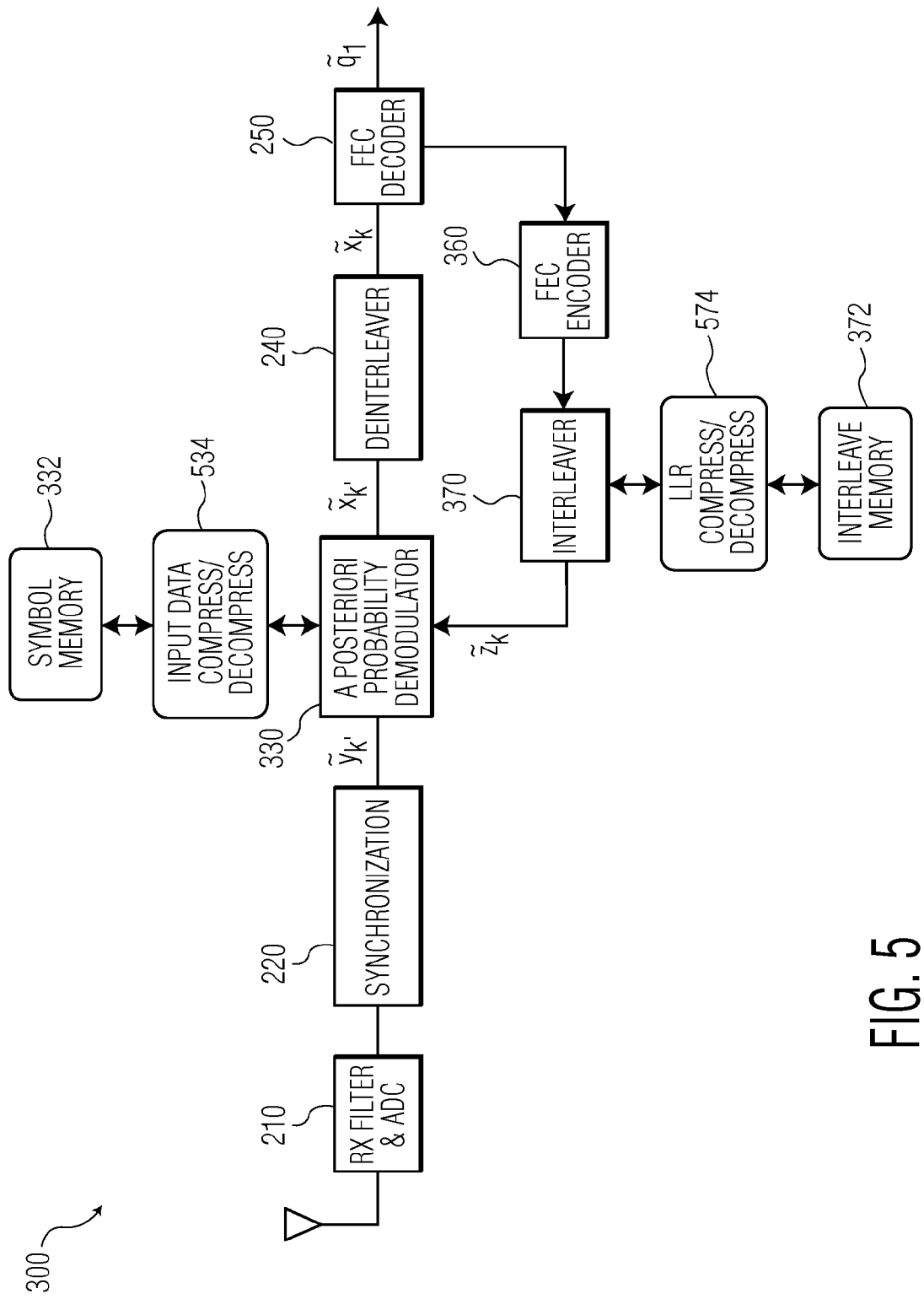
FIG. 5 illustrates a block diagram of a third embodiment of a digital receiver baseband system using iterative demodulation.

FIG. 5 illustrates a block diagram of a third embodiment of a digital receiver baseband system using iterative demodulation. The digital receiver baseband system of FIG. 5 is the same as the digital receiver baseband system of FIG. 3 except for the addition of compression of the data stored in the symbol memory 332 and the interleave memory 372. A symbol compressor/decompressor 534 compresses the received symbols that are then stored in the symbol memory 332. The symbol compressor/decompressor 534 may also decompress compressed symbols stored in the symbol memory 332 for use in a later demodulation iteration. The symbol compressor/decompressor 534 may use lossy compression, lossless compression, or a combination of lossy and lossless compression. Some (lossless or almost lossless) compression may already applied as the data is received. However, additional lossy compression is performed only after the data has been used for the initial demodulation. For this reason, the loss in precision does not affect the result of the first iteration. Because the second iteration may use the feedback data that leads to improved performance, the demodulator may tolerate the lowered precision and does not suffer much performance loss versus the situation where the uncompressed symbols are stored.

In a similar manner, a LLR compressor/decompressor 574 may compress the LLR data that needs to be stored and then deinterleaved. Then when the data is to be deinterleaved, the LLR compressor/decompressor 574 may decompress the interleaved LLR data stored in the interleave memory 372. Again, LLR compressor/decompressor 574 may use lossy compression, lossless compression, or a combination of lossy and lossless compression.

Various elements of the digital receiver baseband system of FIG. 5 may be implemented by software running on a processor. For example any of the a posteriori probability demodulator 330, deinterleaver 240, FEC decoder 250, FEC encoder 360, interleaver 370, symbol compressor/decompressor 534, and LLR compressor/decompressor 574 may be implemented in this way, either individually or in any combination. Alternatively, these elements may be implemented as dedicated circuits that may be implemented in a single integrated circuit or multiple integrated circuits.

Figure 6:
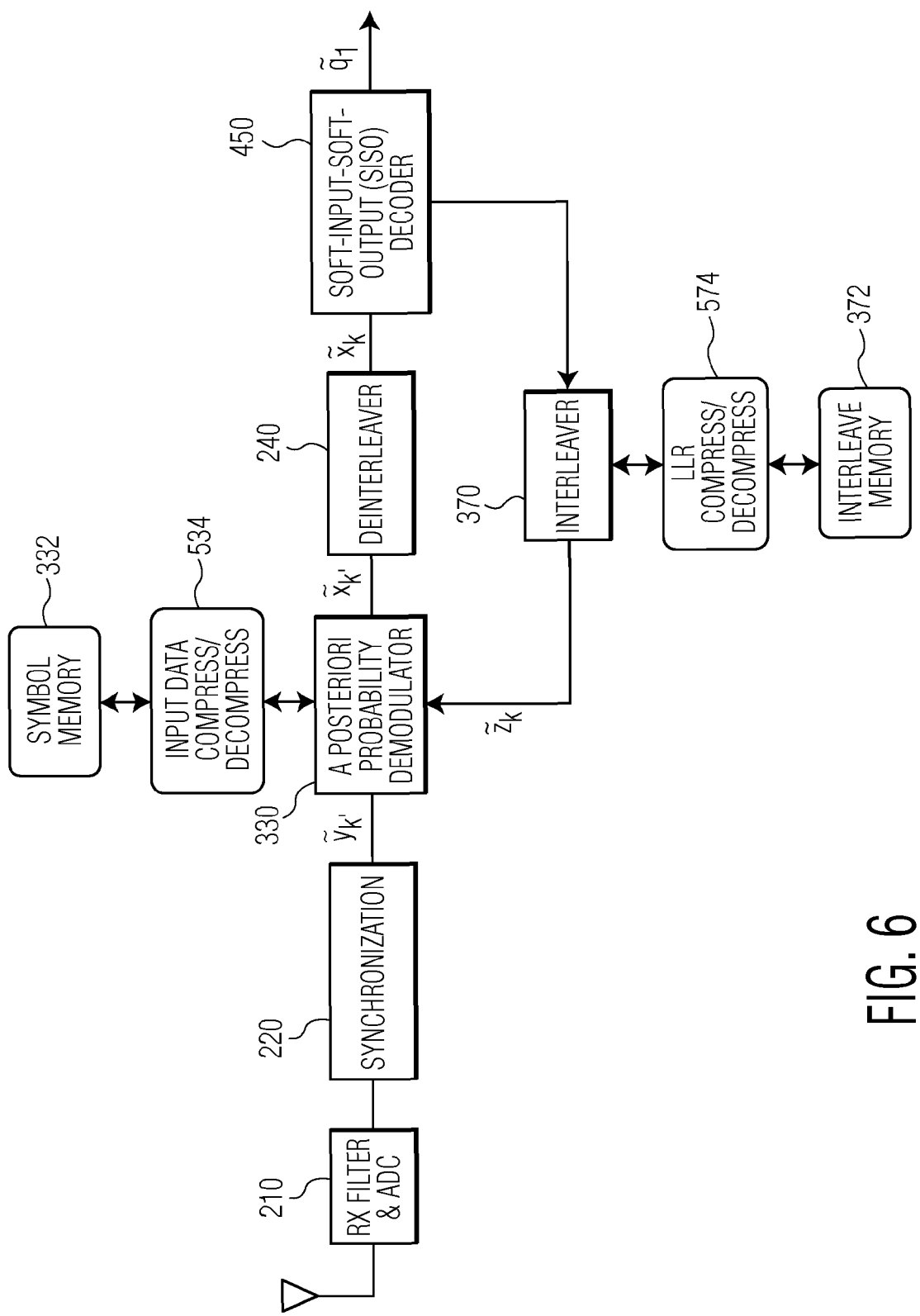
FIG. 6 illustrates a block diagram of a fourth embodiment of a digital receiver baseband system using iterative demodulation.

FIG. 6 illustrates a block diagram of a fourth embodiment of a digital receiver baseband system using iterative demodulation. The digital receiver baseband system of FIG. 6 is the same as the digital receiver baseband system of FIG. 4 except for the addition of compression of the data stored in the symbol memory 332 and the interleave memory 372. Further, the compression of the data stored in the symbol memory 332 and the interleave memory 372 may be accomplished in the same way as described in FIG. 5.

Various elements of the digital receiver baseband system of FIG. 6 may be implemented by software running on a processor. For example any of the a posteriori probability demodulator 330, deinterleaver 240, SISO decoder 450, interleaver 370, symbol compressor/decompressor 534, and LLR compressor/decompressor 574 may be implemented in this way, either individually or in any combination. Alternatively, these elements may be implemented as dedicated circuits that may be implemented in a single integrated circuit or multiple integrated circuits.

The operation of the third embodiment has been modeled with matlab simulations. The simulations are based on a floating point simulation chain of the DAB standard assuming perfect synchronization. To be able to compare the effect of lossy compression in the form of reduced-precision quantization the following simulations have been run for several channel conditions:
   reference simulation (iterative demodulation and decoding with floating point values); and
   compressed symbol buffer simulation (iterative demodulation and decoding with symbol buffer compressed after the first demodulation as described above)

Figure 7:
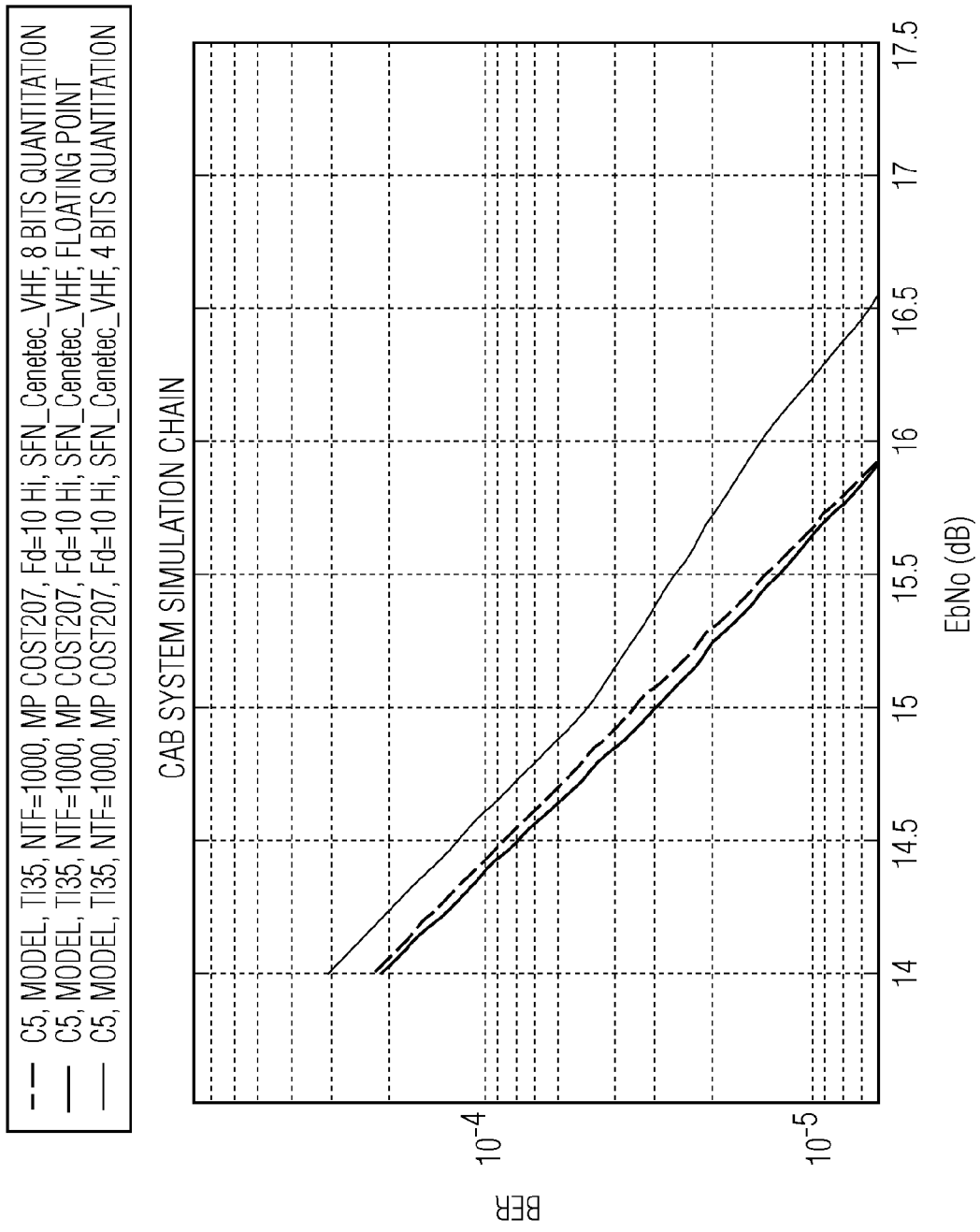
FIGS. 7 and 8 illustrate the performance results of a simulation.
Figure 8:
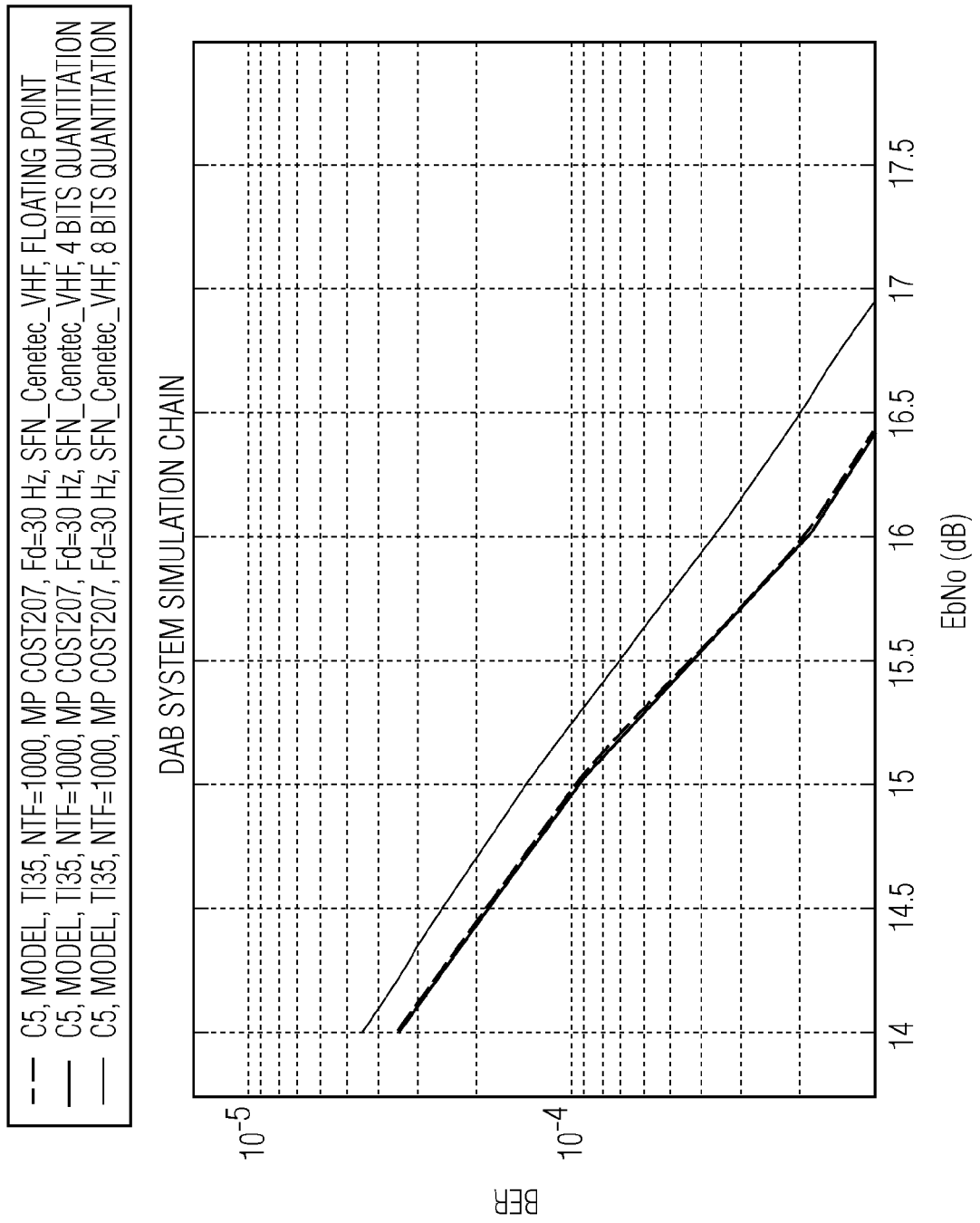

Simulations have been run for various channel models with different parameters. FIGS. 7 and 8 illustrate the results of the simulation. The results are a plot of bit error rate (BER) versus signal to noise ratio (Eb/N0). The reference case corresponds to floating point matlab simulation. The fixed-point reference case of 16-bit precision is assumed to be same curve or very close. The remaining two curves correspond to 8-bit and 4-bit precision. The performance is measured at the required BER level $10^{-4}$. In both 8-bit and 4-bit precision cases, decrease of gain due to compression was found to be 0.3 dB at most, while the memory requirement for the symbol buffer was decreased by 75% for the 4-bit case. In each simulation, a Cenelec SFN channel is used and 4-bit quantization is applied to the symbol data. The LLR data is kept at 5-bit precision, so here the effect of symbol buffer compression is seen. The multipath model used is based on COST207 channel model and an SFN Cenelec channel is simulated in this case. TI35 corresponds to the specific DAB profile simulated, and NTF=1000 denotes that 1000 DAB transport frames have been simulated to calculate the given BER figures. The plots shown in FIGS. 7 and 8 use two different values for the Doppler frequency Fd.

The embodiments described above may be applied to all wireless standards for broadcast, networking, cellular, etc. applications. The advantages are especially seen in case of broadcast standards or other applications which specify long interleavers and therefore require a large buffer memory for closed-loop operation.

Further, as described above various types and combinations of compression may be used to compress the symbol and LLR data. Also, only the symbol data or only the LLR data may be compressed.

It should be noted that various aspects of the above embodiments may be combined resulting in other embodiments. Also, various steps in the methods may be performed in a different order or simultaneously. Also various aspects of the embodiments above may be implemented using processors and computer instructions to result in a specific machine implementing the embodiment. Also, portions of the embodiments above may be implemented using ASICs or other specific hardware elements.

As used herein, the term "processor" will be understood to encompass a variety of devices such as microprocessors, field-programmable gate arrays (FPGAs), application-specific integrated circuits (ASICs), and other similar processing and computing devices.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A receiver, comprising:
    an a posteriori probability demodulator configured to receive an input digital signal and output demodulated data;
    a deinterleaver configured to deinterleave the demodulated data;
    a forward error correction (FEC) decoder configured to error correct the demodulated data;
    a FEC encoder configured to encode the error corrected demodulated data;
    an interleaver configured to interleave the FEC encoded data and output the interleaved FEC encoded data to the a posteriori probability demodulator; and
    a symbol compressor/decompressor configured to compress symbol data from the a posteriori demodulator and store the compressed data in a symbol memory and configured to decompress compressed symbol data stored in the symbol memory, wherein in a second demodulation iteration, the symbol data, which is the decompressed compressed symbol data, is less precise than the symbol data in a first demodulation iteration.

2. The system of claim 1, wherein compressing the symbol data includes quantizing the symbol data.

3. The system of claim 1, wherein compressing the symbol data includes using one of lossy compression, lossless compression, and lossless and lossy compression.

4. The system of claim 1, further comprising a log likelihood ratio (LLR) compressor/decompressor configured to compress LLR data from the interleaver and store the compressed LLR data in an interleave memory and configured to decompress compressed LLR data stored in the interleave memory.

5. The system of claim 4, wherein compressing the LLR data includes quantizing the LLR data.

6. The system of claim 4, wherein compressing the symbol data includes using one of lossy compression, lossless compression, and lossless and lossy compression.

7. A receiver, comprising:
    an a posteriori probability demodulator configured to receive an input digital signal and output demodulated data;
    a deinterleaver configured to deinterleave the demodulated data;
    a soft input soft output (SISO) decoder configured to decode the demodulated data;
    an interleaver configured to interleave the demodulated data and output the interleaved demodulated data to the a posteriori probability demodulator; and
    a symbol compressor/decompressor configured to compress symbol data from the a posteriori demodulator and store the compressed data in a symbol memory and configured to decompress compressed symbol data stored in the symbol memory, wherein in a second demodulation iteration, the symbol data, which is the decompressed compressed symbol data, is less precise than the symbol data in a first demodulation iteration.

8. The system of claim 7, wherein compressing the symbol data includes quantizing the symbol data.

9. The system of claim 7, wherein compressing the symbol data includes using one of lossy compression, lossless compression, and lossless and lossy compression.

10. The system of claim 7, further comprising a log likelihood ratio (LLR) compressor/decompressor configured to compress LLR data from the interleaver and store the compressed LLR data in an interleave memory and configured to decompress compressed LLR data stored in the interleave memory.

11. The system of claim 10, wherein compressing the LLR data includes quantizing the LLR data.

12. The system of claim 10, wherein compressing the symbol data includes using one of lossy compression, lossless compression, and lossless and lossy compression.

13. A non-transitory machine-readable storage medium encoded with instructions for execution by a processor in a receiver, comprising:
    instructions for an a posteriori probability demodulating an input digital signal and outputting demodulated data;
    instructions for deinterleaving the demodulated data;
    instructions for a forward error correction (FEC) decoding the demodulated data;
    instructions for FEC encoding the error corrected demodulated data;
    instructions for interleaving the FEC encoded data;
    instructions for compressing symbol data from the demodulated data and storing the compressed data in a symbol memory; and
    instructions for decompressing compressed symbol data stored in the symbol memory, wherein in a second demodulation iteration, the symbol data, which is the decompressed compressed symbol data, is less precise than the symbol data in a first demodulation iteration.

14. The non-transitory machine-readable storage medium of claim 13, wherein compressing the symbol data includes quantizing the symbol data.

15. The non-transitory machine-readable storage medium of claim 13, further comprising:
    instructions for compressing interleaved data and storing the compressed interleaved data in an interleave memory; and
    instructions for decompressing compressed interleaved data stored in the interleave memory.

16. The non-transitory machine-readable storage medium of claim 15, wherein compressing the interleaved data includes quantizing the interleaved data.

17. A non-transitory machine-readable storage medium encoded with instructions for execution by a processor in a receiver, comprising:
- instructions for an a posteriori probability demodulating an input digital signal and outputting demodulated data;
- instructions for deinterleaving the demodulated data;
- instructions for soft input soft output (SISO) decoding the demodulated data;
- instructions for interleaving the SISO decoded data;
- instructions for compressing symbol data from the demodulated data and storing the compressed data in a symbol memory; and
- instructions for decompressing compressed symbol data stored in the symbol memory,
- wherein in a second demodulation iteration, the symbol data, which is the decompressed compressed symbol data, is less precise than the symbol data in a first demodulation iteration.

18. The non-transitory machine-readable storage medium of claim 17, wherein compressing the symbol data includes quantizing the symbol data.

19. The non-transitory machine-readable storage medium of claim 17, further comprising:
- instructions for compressing interleaved data and storing the compressed interleaved data in an interleave memory; and
- instructions for decompressing compressed interleaved data stored in the interleave memory.

20. The non-transitory machine-readable storage medium of claim 19, wherein compressing the interleaved data includes quantizing the interleaved data.

* * * * *